(12) United States Patent
Ma et al.

(10) Patent No.: US 8,067,252 B2
(45) Date of Patent: Nov. 29, 2011

(54) METHOD FOR DETERMINING LOW-NOISE POWER SPECTRAL DENSITY FOR CHARACTERIZING LINE EDGE ROUGHNESS IN SEMICONDUCTOR WAFER PROCESSING

(75) Inventors: Yuansheng Ma, Santa Clara, CA (US); Harry J. Levinson, Saratoga, CA (US); Thomas Wallow, San Carlos, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 766 days.

(21) Appl. No.: 11/706,118

(22) Filed: Feb. 13, 2007

(65) Prior Publication Data

US 2008/0194046 A1    Aug. 14, 2008

(51) Int. Cl.
*H01L 21/66* (2006.01)
(52) U.S. Cl. .................................... 438/16; 257/E21.53
(58) Field of Classification Search ............ 438/14, 438/16, 17, 18; 257/E21.53
See application file for complete search history.

(56) References Cited

U.S. PATENT DOCUMENTS

2006/0095254 A1\*    5/2006    Walker et al. ................. 704/207

\* cited by examiner

*Primary Examiner* — Bradley K Smith
*Assistant Examiner* — Amar Movva
(74) *Attorney, Agent, or Firm* — Farjami & Farjami LLP

(57) ABSTRACT

According to one exemplary embodiment, a method for determining a power spectral density of an edge of at least one patterned feature situated over a semiconductor wafer includes measuring the edge of the at least one patterned feature at a number of points on the edge. The method further includes determining an autoregressive estimation of the edge of the at least one patterned feature using measured data corresponding to a number of points on the edge. The method further includes determining a power spectral density of the edge using autoregressive coefficients from the autoregressive estimation. The method further includes utilizing the power spectral density to characterize line edge roughness of the at least one patterned feature in a frequency domain.

13 Claims, 5 Drawing Sheets

METHOD FOR DETERMINING LOW-NOISE POWER SPECTRAL DENSITY FOR CHARACTERIZING LINE EDGE ROUGHNESS IN SEMICONDUCTOR WAFER PROCESSING

TECHNICAL FIELD

The present invention is generally in the field of electronics. More particularly, the invention is in the field of semiconductor wafer fabrication.

BACKGROUND ART

As semiconductor devices provided by modern semiconductor technology continue to scale down in size, critical dimension variation across a semiconductor wafer can significantly affect the production yield and electrical performance of the devices fabricated on the wafer. A high percentage of the critical dimension variation is caused by "line edge roughness" resulting from lithographic processing of the semiconductor wafer. "Line edge roughness" refers to variations that occur along an edge of a patterned feature as a result of semiconductor wafer processing. To understand the specific causes of line edge roughness, power spectral density for an edge of a patterned feature, such as a transistor gate, can be determined and utilized to analyze the distribution of line edge roughness in the "frequency domain."

In the present application, "frequency domain" refers to the summation of frequencies into which line edge roughness can be resolved. Line edge roughness is typically measured in a spatial dimension, such as length of deviation from a reference line. However, the variations that occur along the length of an edge of a patterned feature, i.e. the line edge roughness, can be represented as a summation of different frequency components, i.e., the "frequency domain" of the line edge roughness.

In a conventional approach, line edge roughness can be represented in the frequency domain by determining power spectral density for an edge of a patterned feature by utilizing a fast Fourier transform algorithm. In the conventional approach, line edge roughness is typically measured by using a tool such as a scanning electron microscope. However, since the scanning electron microscope has limited sampling length and resolution, the power spectral density determined by the fast Fourier transform algorithm includes a large amount of noise, which undesirably reduces the accuracy of the line edge roughness represented by the power spectral density.

SUMMARY

A method for determining low-noise power spectral density for characterizing line edge roughness in semiconductor wafer processing, substantially as shown in and/or described in connection with at least one of the figures, and as set forth more completely in the claims.

DETAILED DESCRIPTION OF THE INVENTION

The present invention is directed to a method for determining low-noise power spectral density for characterizing line edge roughness in semiconductor wafer processing. The following description contains specific information pertaining to the implementation of the present invention. One skilled in the art will recognize that the present invention may be implemented in a manner different from that specifically discussed in the present application. Moreover, some of the specific details of the invention are not discussed in order not to obscure the invention.

The drawings in the present application and their accompanying detailed description are directed to merely exemplary embodiments of the invention. To maintain brevity, other embodiments of the present invention are not specifically described in the present application and are not specifically illustrated by the present drawings.

The present invention provides an innovative method of determining accurate, low-noise power spectral density of a line edge for characterizing line edge roughness of a patterned feature, such as a transistor gate, in the frequency domain. Although a line edge of a patterned feature comprising a resist material is utilized to illustrate the present invention, the present invention can generally be utilized in semiconductor wafer processing to advantageously determine an accurate, low-noise power spectral density of a line edge of a feature patterned in any type of material, such as a conductive or dielectric material.

Figure 1:
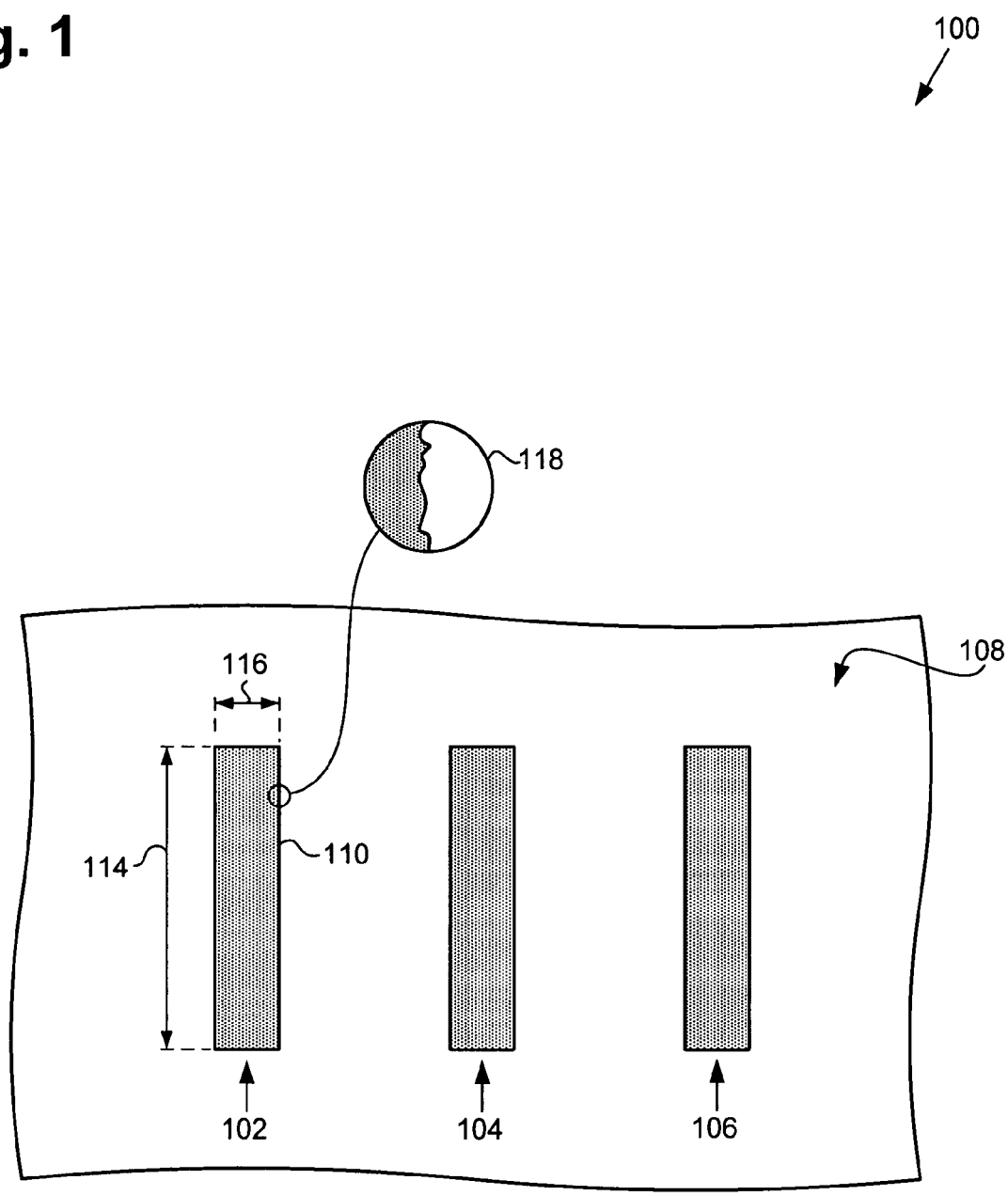
FIG. 1 illustrates a top view of exemplary patterned features situated over a portion of a semiconductor wafer.

FIG. 1 shows a top view of structure 100, which includes exemplary features situated over a layer. Structure 100 includes patterned features 102, 104, and 106 and layer 108, which is situated over a substrate (not shown in FIG. 1). Structure 100 can be a portion of a semiconductor wafer at an intermediate stage of fabrication. As shown in FIG. 1, patterned features 102, 104, and 106 are situated over layer 108 and can comprise photoresist or other suitable resist material. For example, patterned features 102, 104, and 106 can be formed by depositing a layer of photoresist over layer 108 and patterning the layer of photoresist in a lithographic process. Patterned features 102, 104, and 106 can each be utilized to pattern, for example, a gate of a field effect transistor (FET) in layer 108 in a subsequent etch process.

Also shown in FIG. 1, patterned feature 102 includes edge 110, which is also referred to as a "line edge" in the present application, and has length 114 and width 116, which can define, for example, corresponding dimensions of a subsequently patterned gate of a FET. For example, width 116 can define gate length of a FET, which can be patterned in layer 108 in a subsequent etch process. As a result of lithographic processing, variations occur along line edges of each of patterned features 102, 104, and 106. The variations that occur along the line edges, such as edge 110 of patterned feature 102, can be referred to as "line edge roughness." For example, line edge roughness that occurs along edge 110 of feature 102 is shown in expanded view 118 in FIG. 1.

Line edge roughness in features patterned in photoresist, such as patterned features 102, 104, and 106, can be transferred to corresponding device features, such as transistor gates, patterned in layer 108 in a subsequent etch process. As a result, line edge roughness along edge 110 of feature 102 can cause line edge roughness along a corresponding gate edge. Line edge roughness that occurs along a gate edge can cause undesirable variations in gate length, which can significantly-affect device performance. Thus, line edge roughness can cause critical dimension variation across the wafer, which can significantly affect electrical performance of devices, such as FETs, fabricated on the wafer. Thus, it is important to understand the causes of line edge roughness so as to it (i.e. line edge roughness).

The present invention provides a method of determining low-noise power spectral density for a line edge, such as edge 110, of a patterned feature, such as patterned feature 102, so as to accurately characterize line edge roughness of the patterned feature in the frequency domain. The invention's method for determining low-noise power spectral density for a line edge will be discussed below in relation to FIG. 2.

Figure 2:
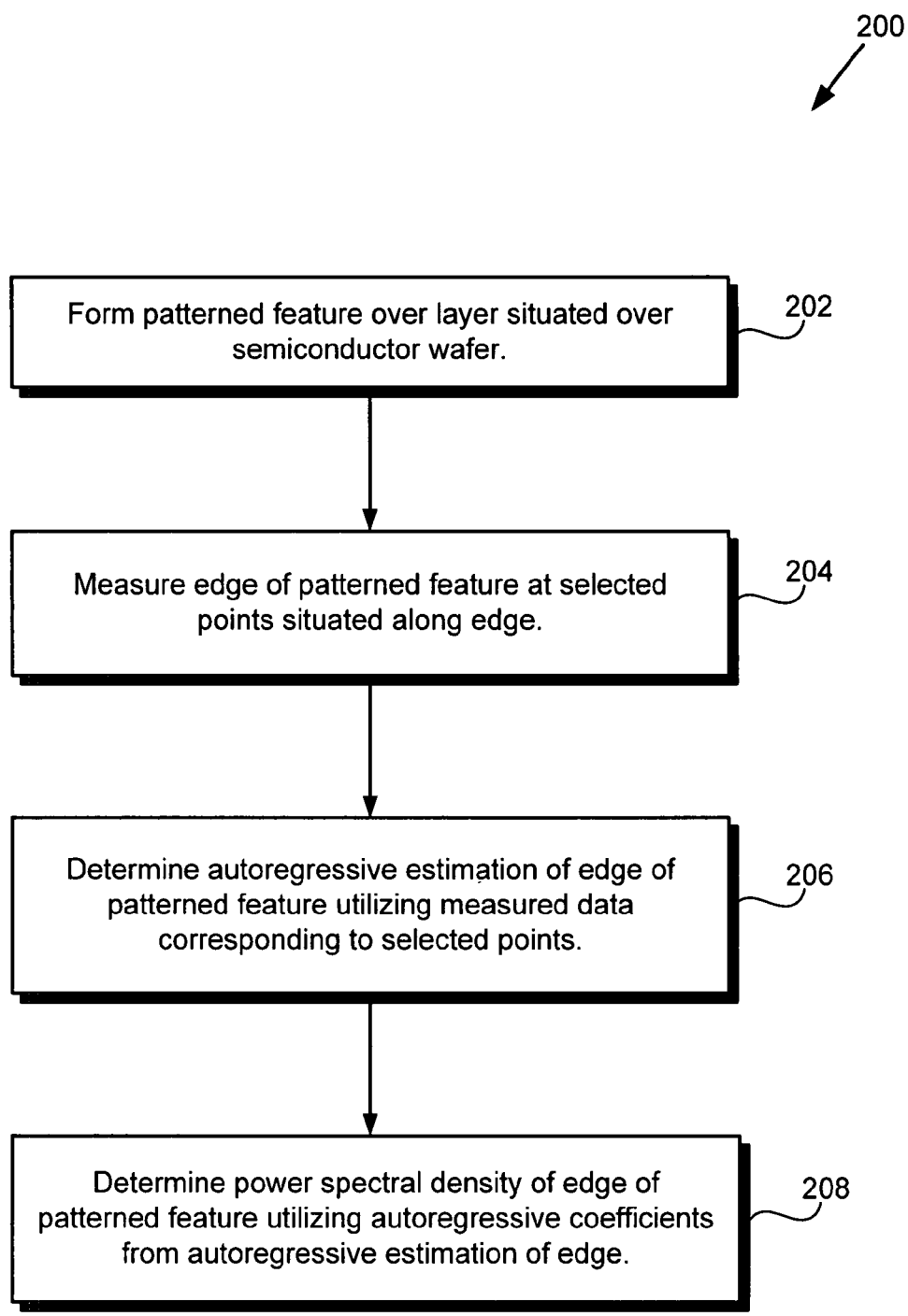
FIG. 2 shows a flowchart illustrating typical steps taken to implement an embodiment of the present invention.

FIG. 2 shows a flowchart illustrating a method for determining low-noise power spectral density of a line edge so as to accurately represent line edge roughness in the frequency domain, in accordance with one embodiment of the present invention. Certain details and features have been left out of flowchart 200 that are apparent to a person of ordinary skill in the art. For example, a step may consist of one or more substeps or may involve specialized equipment or materials, as known in the art. While steps 202, 204, 206, and 208 indicated in flowchart 200 are sufficient to describe one embodiment of the present invention, other embodiments of the invention may utilize steps different from those shown in flowchart 200. It is noted that the steps shown in flowchart 200 are performed on a portion of a semiconductor wafer, which, prior to step 202, includes, among other things, a substrate and one or more overlying layers, such as dielectric and/or conductive layers. The semiconductor wafer is also referred to simply as a wafer or a semiconductor die or simply a die in the present application. In one embodiment, the steps shown in flowchart 200 can be performed on a semiconductor die, such as a microprocessor die, that is situated on the semiconductor wafer.

Referring now to step 202 in FIG. 2, at step 202 of flowchart 200, patterned feature 102 in FIG. 1 is formed over layer 108, which is situated over a semiconductor wafer. For example, patterned feature 102 can comprise photoresist and can be formed in a lithographic process. Patterned feature 102 can be utilized to form, for example, a transistor gate in layer 108 in a subsequent processing step. At step 204 of flowchart 200, edge 110 of patterned feature 102 is measured at a selected number of points. For example, edge 110 can be measured at each of the selected number of points situated along edge 110 by utilizing a tool such as a scanning electron microscope or an atomic force microscope to acquiring an image of edge 110 including the selected points and determining the coordinates of each point from the acquire image. By measuring edge 110 of patterned feature 102 at each of the selected points, the line edge roughness at each of the selected points is also being measured.

At step 206 of flowchart 200, an autoregressive estimation of edge 110 of patterned feature 102 is determined utilizing measured data corresponding to the selected points. The measured data can include a value for each selected point that corresponds to the coordinates of that point along the line edge. The autoregressive estimation of edge 110 can be determined, for example, by utilizing the equation:

$$z(k) = n(k) + \sum_{i=1}^{N} a_i z(k-i) \quad \text{equation (1)}$$

where z(k) is an estimated value of edge 110 at point k, n(k) is a white noise sequence, $a_i$ are autoregressive coefficients, and N is the autoregressive order. The autoregressive coefficients in equation (1) can be determined by using an autoregressive algorithm, such as the Yule-Walker algorithm or the Burg algorithm. However, the autoregressive coefficients can also be determined by using a covariance method, a recursive maximum likelihood estimation method, or other methods as known by one of ordinary skill in the art.

A value for N, i.e., the autoregressive order in equation (1), can be determined, for example, by initially setting N=1, determining the autoregressive coefficients as discussed above, and determining z(k), i.e., an estimated value of edge 110 at point k. The difference between the estimated value of z(k) from equation (1) and the measured value of edge 110 at point k (as measured at step 204 of flowchart 200) is then determined. The above process is continued for N=2, N=3, etc. The value of N is selected to be the value that results in the smallest difference between the estimated value of z(k) from equation (1) and the measured value of edge 110 at point k. The value for N can also be determined by using other methods as known in the art.

At step 208 of flowchart 200, the power spectral density of edge 110 of patterned feature 102 is determined by utilizing the autoregressive coefficients, i.e., $a_i$, and the autoregressive order determined from the autoregressive estimation of edge 110. After the autoregressive coefficients and the autoregressive order have been the determined, power spectral density of edge 110 can be determined, for example, by utilizing the equation:

$$S(f) = \frac{\varepsilon^2 \Delta z}{\left|1 + \sum_{i=1}^{N} a_i e^{-j2\pi i f \Delta z}\right|} \quad \text{equation (2)}$$

where $\in$ is a white noise sequence corresponding to the white noise spectrum power, f is frequency, $a_i$ are the autoregressive coefficients, N is the autoregressive order, and $\Delta z$ is the resolution of the tool, such as a scanning electron microscope or an atomic force microscope, that was utilized to measure edge 110 of patterned feature 102 at step 204 of flowchart 200.

The power spectral density of edge 110 can be determined for a desired range of frequencies by plotting S(f) over the desired range of frequencies. The power spectral density, as determined by equation (2), is substantially noise-free and, thereby, provides an accurate characterization of line edge roughness of edge 110 of patterned feature 102 in the frequency domain. The invention's power spectral density can be utilized to quickly and accurately measure the relative intensity of one or more of the component frequencies that determine the line edge roughness of a line edge of a patterned feature.

The invention's power spectral density can be utilized to determine if line edge roughness of patterned feature 102 meets predetermined criteria so as to monitor and improve semiconductor fabrication processes, such as lithographic processes. For example, if the line edge roughness of edge 110 of patterned feature 102 meets the predetermined criteria, which can be determined from previous measurement data, wafer processing can continue by patterning a gate of a FET corresponding to patterned feature 102 in an underlying layer situated over the wafer. For example, if the line edge roughness of edge 110 of patterned feature 102 does not meet the predetermined criteria, patterned feature 102 can be removed from the wafer and it can be can be re-formed with new photoresist.

By utilizing the present invention, an overall power spectral density can be determined across a wafer by quickly and accurately determine power spectral densities for a few line edges on the wafer. The overall power spectral density can be advantageously utilized to predict CD (critical dimension) variation across the wafer, such as gate length variation across the wafer. By predicting CD variation across the wafer, related electrical characteristics of devices, such as FETs, can also be predicted.

Figure 3:
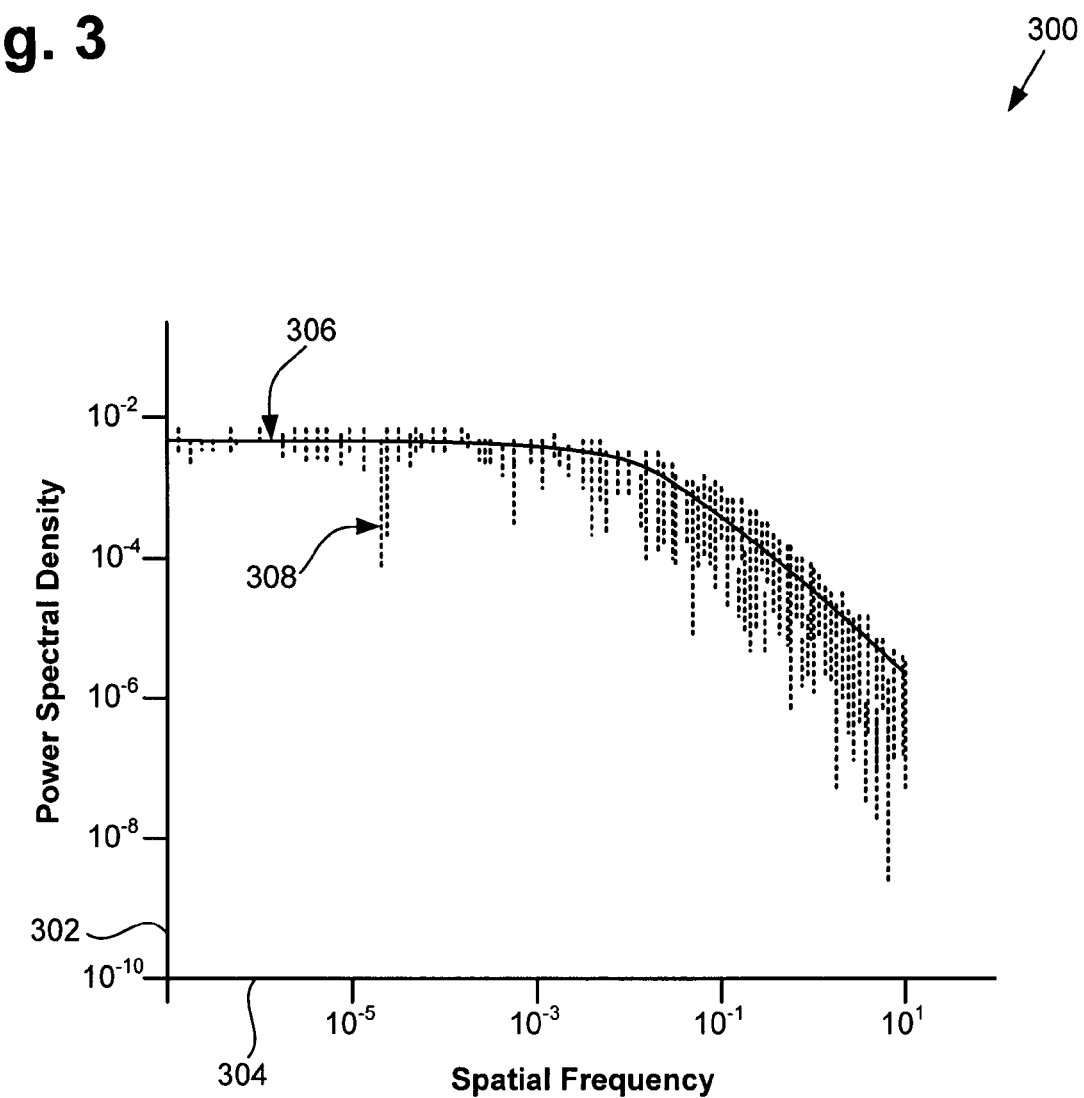
FIG. 3 is a graph showing an exemplary conventional power spectral density curve based on a fast Fourier transform.

FIG. 3 shows graph 300 including exemplary power spectral density curves. Graph 300 includes power spectral density axis 302, spatial frequency axis 304, ideal power spectral density curve 306, and conventional power spectral density curve 308. In graph 300, power spectral density axis 302 shows an exemplary range of normalized power spectral density and spatial frequency axis 304 shows an exemplary range of spatial frequencies. Power spectral density is normalized on power spectral density axis 302 and, therefore, has no units. On spatial frequency axis 304, "spatial frequency" refers to the inverse of a period, i.e., one over the period, of a frequency component of line edge roughness. As discussed above, line edge roughness can be resolved into a summation of different frequency components, i.e., the "frequency domain" of the line edge roughness. Thus, spatial frequency axis 304 shows the inverse of a range of periods of the frequency components that form the line edge roughness.

In graph 300, ideal power spectral density curve 306 (shown as a solid line in graph 300) is an ideal power spectral density curve used to generate the line edge (corresponding to a known line edge). Also in graph 300, conventional power spectral density curve 308 (shown as a series of vertical broken lines in graph 300) corresponds to a power spectral density curve that is generated by utilizing a fast Fourier transform algorithm for the line edge generated with curve 306.

In the example shown in graph 300, conventional power spectral density curve 308 includes a large amount of noise, which is indicated in graph 300 by vertical broken lines that extend above and below ideal power spectral density curve 306. The large amount of noise in conventional power spectral density curve 308 occurs as a result of the fast Fourier transform algorithm utilized to generate the curve. As a result of the large amount of noise in conventional power spectral density curve 308, it (i.e. conventional power spectral density curve 308) inaccurately characterizes line edge roughness by inaccurately representing the frequency components of line edge roughness.

Figure 4:
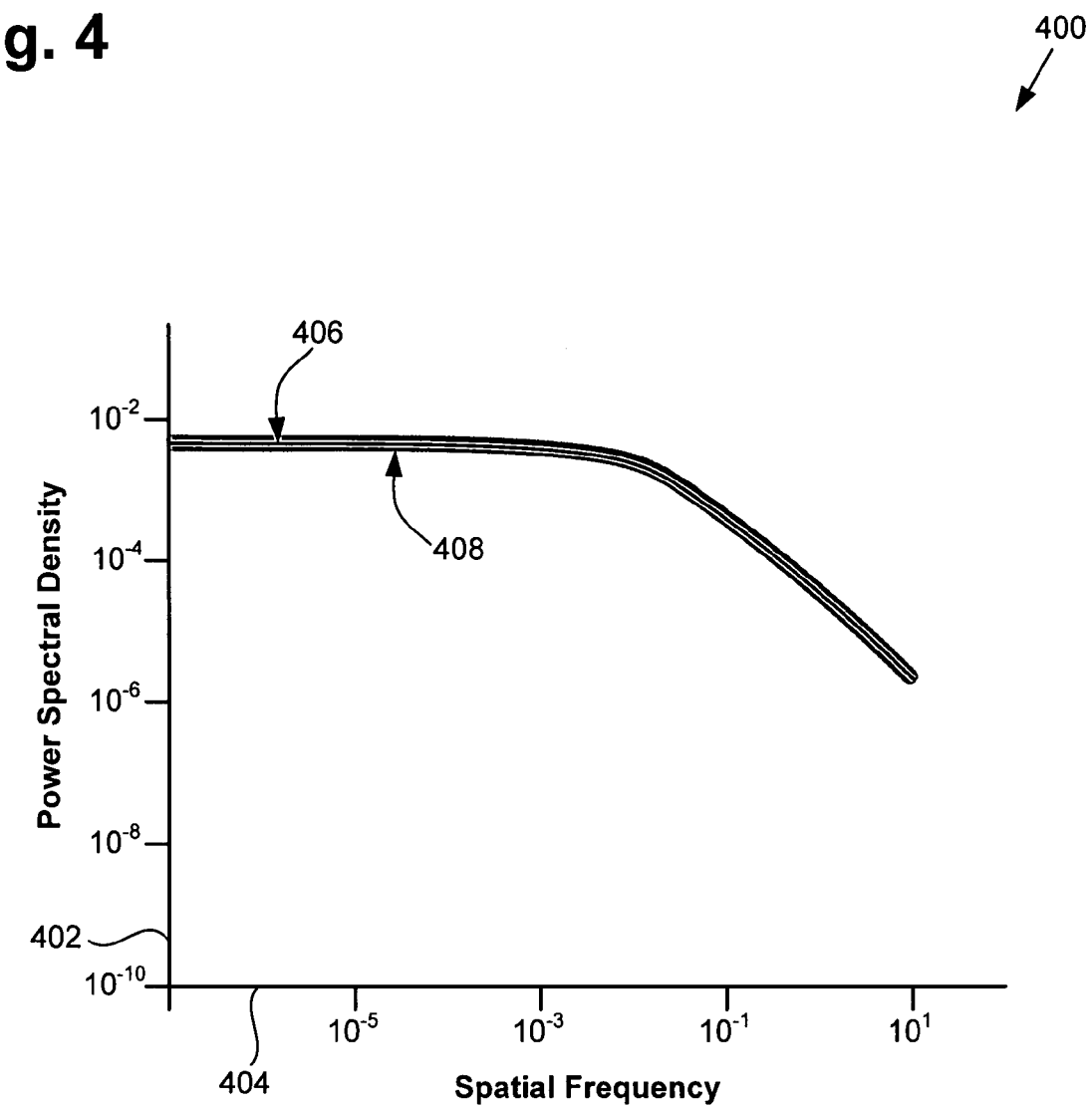
FIG. 4 is a graph showing an exemplary power spectral density curve in accordance with one embodiment of the present invention.

FIG. 4 shows graph 400 including autoregressive-based power spectral density curve 408 in accordance with one embodiment of the present invention. Graph 400 includes power spectral density axis 402, spatial frequency axis 404, ideal power spectral density curve 406, and autoregressive-based power spectral density curve 408. In graph 400, power spectral density axis 402 shows an exemplary range of normalized power spectral density and spatial frequency axis 404 shows an exemplary range of spatial frequencies.

In graph 400, ideal power spectral density curve 406 (shown as a solid line in graph 400) corresponds to ideal power spectral density curve 306 in graph 300 in FIG. 3. Also in graph 400, autoregressive-based power spectral density curve 408 corresponds to a power spectral density curve that is generated by utilizing an autoregressive technique, which includes determining an autoregressive estimation of a line edge as discussed in flowchart 200 in FIG. 2.

In the example shown in graph 400, autoregressive-based power spectral density curve 408 has substantially no noise and accurately tracks ideal power spectral density curve 408. As a result, autoregressive-based power spectral density curve 408 accurately represents the frequency components of line edge roughness of a line edge. Thus, in contrast to conventional power spectral density curve 308 in FIG. 3, which is generated utilizing a fast Fourier transform algorithm, autoregressive-based power spectral density curve 408, which is generated according to an embodiment of the present invention, can accurately characterize line edge roughness of a line edge in the frequency domain.

Figure 5:
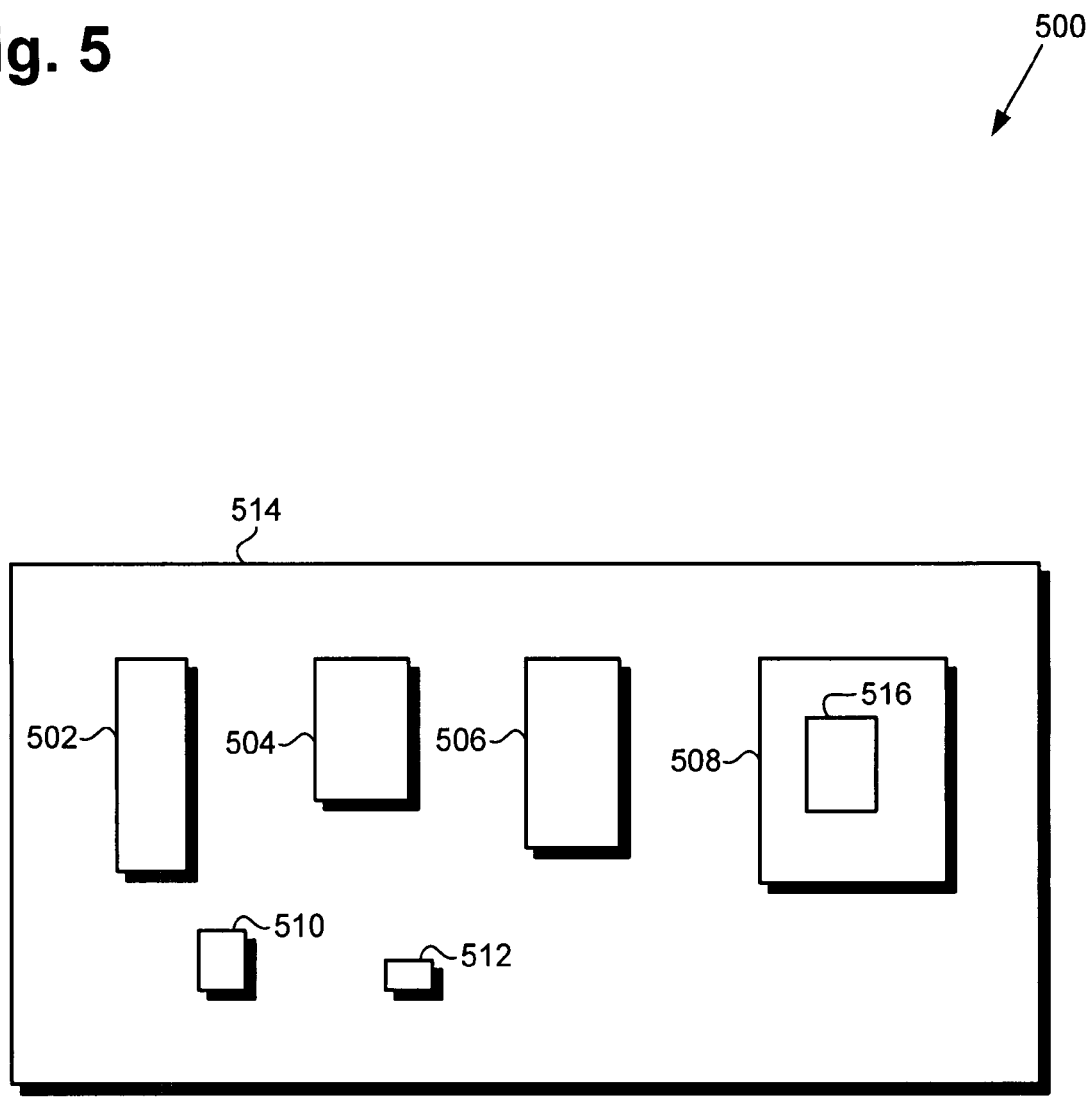
FIG. 5 illustrates a diagram of an exemplary electronic system including an exemplary IC chip or semiconductor die fabricated by utilizing a method of determining power spectral density of an edge of at least one patterned feature in accordance with one embodiment of the present invention.

FIG. 5 illustrates a diagram of an exemplary electronic system including an exemplary chip or die fabricated by utilizing a power spectral density of an edge of at least one patterned featured determined in accordance with one embodiment of the present invention. Electronic system 500 includes exemplary modules 502, 504, and 506, IC chip 508 (also referred to as semiconductor die 508 in the present application), discrete components 510 and 512, residing in and interconnected through circuit board 514. In one embodiment, electronic system 500 may include more than one circuit board. IC chip 508 can comprise a semiconductor die that is fabricated by using an embodiment of the invention's method for determining power spectral density of an edge of at least one patterned feature, such as the method of flowchart 200 in FIG. 2. For example, the power spectral density can be utilized to characterize line edge roughness of the patterned feature in the frequency domain in a lithographic process during fabrication of the semiconductor die. IC chip 508 includes circuit 516, which can be a microprocessor, for example.

As shown in FIG. 5, modules 502, 504, and 506 are mounted on circuit board 514 and can each be, for example, a central processing unit (CPU), a graphics controller, a digital signal processor (DSP), an application specific integrated circuit (ASIC), a video processing module, an audio processing module, an RF receiver, an RF transmitter, an image sensor module, a power control module, an electro-mechanical motor control module, or a field programmable gate array (FPGA), or any other kind of module utilized in modern electronic circuit boards. Circuit board 514 can include a number of interconnect traces (not shown in FIG. 5) for interconnecting modules 502, 504, and 506, discrete components 510 and 512, and IC chip 508.

Also shown in FIG. 5, IC chip 508 is mounted on circuit board 514 and can comprise, for example, any semiconductor die that is fabricated by utilizing an embodiment of the invention's method for determining power spectral density of an edge of at least one patterned feature. In one embodiment, IC chip 508 may not be mounted on circuit board 514, and may be interconnected with other modules on different circuit boards. Further shown in FIG. 5, discrete components 510 and 512 are mounted on circuit board 514 and can each be, for example, a discrete filter, such as one including a BAW or SAW filter or the like, a power amplifier or an operational amplifier, a semiconductor device, such as a transistor or a diode or the like, an antenna element, an inductor, a capacitor, or a resistor.

Electronic system 500 can be utilized in, for example, a wired communications device, a wireless communications device, a cell phone, a switching device, a router, a repeater, a codec, a LAN, a WLAN, a Bluetooth enabled device, a digital camera, a digital audio player and/or recorder, a digital video player and/or recorder, a computer, a monitor, a television set, a satellite set top box, a cable modem, a digital automotive control system, a digitally-controlled home appliance, a printer, a copier, a digital audio or video receiver, an RF transceiver, a personal digital assistant (PDA), a digital game playing device, a digital testing and/or measuring device, a digital avionics device, a medical device, or a digitally-controlled medical equipment, or in any other kind of system, device, component or module utilized in modern electronics applications.

As discussed above, the invention provides a method for determining low-noise power spectral density for one or more line edges of patterned features formed over a semiconductor wafer. By determining low-noise power spectral density for a line edge, the invention advantageously allows line edge roughness to be quickly and accurately characterized for a patterned feature in the frequency domain.

From the above description of the invention it is manifest that various techniques can be used for implementing the concepts of the present invention without departing from its scope. Moreover, while the invention has been described with specific reference to certain embodiments, a person of ordinary skill in the art would appreciate that changes can be made in form and detail without departing from the spirit and the scope of the invention. Thus, the described embodiments are to be considered in all respects as illustrative and not restrictive. It should also be understood that the invention is not limited to the particular embodiments described herein but is capable of many rearrangements, modifications, and substitutions without departing from the scope of the invention.

Thus, a method for determining low-noise power spectral density for charactering line edge roughness in semiconductor wafer processing has been described.

The invention claimed is:

1. A method for determining an autoregressive representation of a power spectral density of an edge of at least one patterned feature situated over a semiconductor wafer, said method comprising steps of:
    measuring data corresponding to a plurality of points on said edge using a scanning electron microscope or an atomic force microscope;
    determining an autoregressive estimation of said edge of said at least one patterned feature using said data;
    producing an autoregressive representation of said power spectral density of said edge using autoregressive coefficients from said autoregressive estimation;
    said autoregressive representation of said power spectral density representing a physical characteristic of said edge so as to be suitable for determining whether said edge meets a critical dimension variation criteria for said physical characteristic.

2. The method of claim 1 further comprising utilizing said autoregressive representation of said power spectral density to characterize line edge roughness of said at least one patterned feature in a frequency domain.

3. The method of claim 1 further comprising utilizing said method of determining said autoregressive representation of said power spectral density of said edge of said at least one patterned feature to fabricate a semiconductor die comprising said at least one patterned feature.

4. The method of claim 3 further comprising utilizing said semiconductor die in a circuit board.

5. The method of claim 1, wherein said autoregressive coefficients are determined by using an autoregressive algorithm.

6. The method of claim 5, wherein said autoregressive algorithm is selected from the group consisting of a Burg algorithm and a Yule-Walker algorithm.

7. The method of claim 1, wherein said at least one patterned feature is utilized to form a transistor gate in an underlying layer.

8. The method of claim 1, wherein said step of determining said autoregressive estimation of said edge includes determining an autoregressive order for said autoregressive estimation.

9. The method of claim 1, wherein said autoregressive estimation of said edge is determined by:

$$z(k) = n(k) + \sum_{i=1}^{N} a_i z(k-i);$$

wherein $z(k)$ is an estimated value of said edge at one of said plurality of points, $n(k)$ is a white noise sequence, $a_i$ are said autoregressive coefficients, and N is an autoregressive order.

10. The method of claim 1, wherein said autoregressive representation of said power spectral density is determined by:

$$S(f) = \frac{\varepsilon^2 \Delta z}{\left|1 + \sum_{i=1}^{N} a_i e^{-j2\pi i f \Delta z}\right|};$$

wherein $\varepsilon$ is a white noise sequence, $f$ is a frequency, $a_i$ are said autoregressive coefficients, N is an autoregressive order, and $\Delta z$ is a resolution of a tool utilized to measure said edge of said patterned feature.

11. The method of claim 1 further comprising utilizing said method of determining said autoregressive representation of said power spectral density of said edge of said at least one patterned feature to characterize a semiconductor die fabrication process.

12. The method of claim 11 further comprising utilizing said characterized semiconductor die fabrication process to form a semiconductor die.

13. The method of claim 12 further comprising utilizing said semiconductor die in a circuit board.

* * * * *